United States Patent [19]

Narasimhan et al.

[11] 4,320,251

[45] Mar. 16, 1982

[54] OHMIC CONTACTS FOR SOLAR CELLS BY ARC PLASMA SPRAYING

[75] Inventors: Mandayam C. Narasimhan, Seekonk, Mass.; Barton Roessler, Barrington; Joseph J. Loferski, Providence, both of R.I.

[73] Assignee: Solamat Inc., East Providence, R.I.

[21] Appl. No.: 173,198

[22] Filed: Jul. 28, 1980

[51] Int. Cl.³ .................... H01L 31/06; H01L 31/18; B05D 1/08

[52] U.S. Cl. .................................... 136/256; 136/255; 136/261; 136/262; 427/34; 427/88; 427/191; 427/192; 357/30; 357/65; 29/572; 148/177

[58] Field of Search .................. 427/34, 88, 191, 192; 29/572; 136/256, 255, 260–262; 357/30, 65; 148/177, 186

[56] References Cited

U.S. PATENT DOCUMENTS 3,457,467 7/1969 Amsterdam et al. ............... 136/261
4,003,770 1/1977 Janowiecki et al. ................ 148/174
4,165,558 8/1979 Armitage, Jr. et al. ............. 29/572
4,239,553 12/1980 Barnett et al. ...................... 136/256
4,240,842 12/1980 Lindmayer ......................... 136/256

OTHER PUBLICATIONS

H. J. Hovel, "Semiconductors and Semimetals–vol. 11–Solar Cells", Academic Press, New York (1975), pp. 207–210.
J. Mandelkorn et al., "Simplified Fabrication of Back Surface Electric Field Silicon Cells and Novel Characteristics of Such Cells", *Cont. Record, 9th IEEE Photovoltaic Specialists Conf.,* pp. 66–71, (1972).

*Primary Examiner*—Aaron Weisstuch
*Attorney, Agent, or Firm*—Salter & Michaelson

[57] ABSTRACT

The method of applying ohmic contacts to a semiconductor, such as a silicon body or wafer used in solar cells, by the use of arc plasma spraying, and solar cells resulting therefrom.

19 Claims, 4 Drawing Figures

OHMIC CONTACTS FOR SOLAR CELLS BY ARC PLASMA SPRAYING

The government of the United States of America has rights in this invention pursuant to Contract No. DE-AC02-78ER04749 awarded by the United States Department of Energy.

BACKGROUND OF THE INVENTION

Contacts are required in solar cells to collect the current produced by the photon induced charge carriers which are separated by a charge collecting barrier, one form of which is known in the art as a p/n junction. Such a p/n junction in silicon solar cell wafers is located within 1 micron from that surface of the solar cell which is exposed to sunlight due to several absorption considerations. The contacts placed on the exposed side are called the front contacts and are usually designed to cover minimum area consistent with the ability to collect the current produced by the solar cell. Geometrically, the front contacts usually comprise a series of interconnected parallel narrow bars. Typically, their width is in the 30—50 micron range; their spacing is in the 250—2000 micron range. The back contacts can be a simple continuous sheet covering the entire back surface, although some solar cell manufacturers employ gridded rear contacts in order to minimize the amount of metal used, thereby reducing cost.

Historically, silicon solar cells are made first with plated contacts. The system used was the deposition of nickel by electroless methods, followed by solder buildup to provide adequate conductance, and to provide an interconnectable (solderable) contact area. Later, the ohmic contacts for cells intended for artificial earth satellite power supplies were modified to improve adhesion and ohmic contact quality by first adding a thin layer of gold, deposited by electroless methods, prior to nickel deposition. As space requirements became more demanding (minimum pull strength requirements increased; there was a need to contact a highly polished surface of silicon; the junctions became more shallow and adaptability to welding became a requirement), the contact structure was changed to an evaporated two-layer structure. The first layer consisted of titanium, the second of silver. Later to increase moisture resistance, a thin layer of palladium was added between the titanium and silver layers. This contact system has proven to be satisfactory for space cells and has been adapted to masking methods capable of providing the closely spaced narrow grid pattern required for front contacts on space cells and on cells for concentrator systems.

In addition to these evaporated or plated metal contact systems, various forms of metal pastes and inks, deposited mainly through silk screen masks, have been used for ohmic contacts by some manufacturers. In a few cases, the paste has been dispersed in photo-resistive matrices and patterned by photoexposure methods. These methods are still in a development stage.

Another approach involves the development of a solder-palladium-nickel contact system in which palladium is deposited in thin layers by an electroless plating method and the palladium layer is annealed at low temperature (approximately 300° C.) to form $Pd_2Si$. This layer forms the ohmic contact base and has good adhesion to the silicon. Nickel is plated by the electroless method over this $Pd_2Si$ layer and the contact is finished by a solder build-up. In this system $Pd_2Si$ acts as a diffusion barrier for nickel, which can deteriorate the quality of the charge-separating p/n junction after diffusion during the high temperature (400° C.) heating cycle used to sinter the contacts.

All of the contact systems described above employ metals thick enough (20 to 100 $\mu$m) to ensure sufficient conductance. In addition to the resistance of these metal strips, the "contact resistance" between the silicon wafer or base and the contact metal must be minimized. This contact resistance is determined by two factors: the doping level of the silicon surface and the detailed electronic energy band properties of the metal which determine the resulting contact potential. Even if the contacts satisfy the criteria based on these two factors, the contacts must adhere firmly to the semiconductor base. This is necessary to ensure that the contacts do not deteriorate during use. Mechanical durability also is desirable to ensure ease of handling when arrays are being assembled and to withstand stresses in operation, for example, thermal cycling, etc. In addition, the contacts should be stable, i.e. should not corrode and the metals used in the contacts should not diffuse into the junction where they can reduce cell efficiency or even render the cell useless. Also, solderability and weldability of the contact metals is desired to simplify interconnections between cells.

SUMMARY OF THE INVENTION

The basic concept of this invention resides in the use of well established arc plasma spraying technology to fabricate or apply ohmic contacts directly to a semiconductor such as silicon, although not limited thereto. This is of particular interest to solar cell technology since this method of fabricating contacts has a significant cost advantage. Our process of plasma spraying contacts can provide ohmic contacts to both p and n type silicon. It has been found that this process produces ohmic contacts on silicon having resistivity in the 0.1 to 10 ohm cm range commonly used in the semiconductor industry. In carrying out our invention, we have used several commercially available plasma spraying powders and other selected powders. All these powders, when plasma sprayed, from adherent ohmic contacts to semiconductors such as silicon with varying degrees of contact quality as well as layer bond strength. Some of the powders employed are nickel (Ni), aluminum (Al), molybdenum (Mo), nickel-aluminum (Ni-Al), nickel-phosphorous (Ni-P), and nickel-boron-silicon (Ni-B-Si) alloys. The exact composition and the details of contact quality as well as a range of plasma spray parameters within which the process operates successfully will be disclosed later.

Briefly, in the technique of arc plasma spraying a D.C. arc is maintained between two electrodes, usually tungsten and copper, which are water cooled. Usually the arc medium is low ionization energy gases such as argon, helium, nitrogen, hydrogen or mixtures of these, and the heat input to the arc is controlled by adjusting the voltage of the arc, mainly by gas composition and gun geometry, and arc current, as determined by the power source transformer magnetic saturation. The powder is injected into the arc gas stream where it melts and/or softens and is propelled toward the article upon which the spray material is to be deposited. Since the arc temperatures can be maintained as high as 30,000° C., it is possible to melt and deposit many high melting temperature materials. During plasma spraying the article which is being sprayed does not heat up beyond a few hundred degrees Celsius (200° to 500° C.) and therefore several unique combinations of substrate-coating combinations which cannot be made by any other means are possible. Since the heating of the particle in the plasma stream depends upon both the arc temperature and the dwell time of the particle in the hot plasma stream, it is necessary to control the particle trajectory in the plasma stream. This involves careful control of the particle size distribution as well as the injection pressures of the powder into the plasma stream. Thus, the plasma spray parameters include the gun internal geometry, arc-gas composition, the pressure of the arc-gas in the gun chamber, arc-voltage, arc-current, flow rate of arc-gas, the powder selected, the injection pressure of the powder and its flow rate, particle shape and size distribution and the distance of the sprayed article from the gun.

There are some techniques in the prior art of utilizing arc plasma spraying technology in connection with certain solar energy devices. Specifically, JANO-WIECKI et al, U.S. Pat. No. 4,003,770 dated Jan. 18, 1977, teaches fabrication of solar cells from silicon arc plasma sprayed on to certain metal substrates, while LOFERSKI et al, U.S. Pat. No. 4,166,880 dated Sept. 4, 1979, relates to a solar energy selective absorber which includes a layer of semiconductor applied by arc plasma spraying over a metallic surface. There are, however, no teachings or suggestions in the prior art of using arc plasma spraying technology for applying ohmic contacts to semiconductor wafers, such as silicon, nor would one skilled in the art deem such an approach to be feasible in view of the fragility of the wafers, which would lead one to normally expect that the wafer would fracture when plasma sprayed.

Surprisingly, we have been able to control the plasma spraying parameters and wafer mounting procedures so that the wafers can be reliably sprayed and ohmic contacts made without fracturing. It has proven desirable that the wafers should first be etched to remove the oxide layer prior to spraying and then should be sprayed within a few hours of etching. The sprayed layer is adherent as long as the thickness of the deposited layer is maintained within a certain range and this range differs from alloy to alloy. If the thickness of the plasma sprayed layer is less than a certain value or a lower limit, the deposits are usually not fully interconnected and they perform poorly as current carriers. This lower limit also varies from alloy to alloy and is related to its spreading characteristics. The upper limit of the thickness value is thought to be determined by the thermal stresses established during spraying and cooling operations. The sprayed ohmic contacts are experimentally found to have low contact resistance.

In addition to fabricating ohmic contacts to p or n type silicon, we have, pursuant to this invention, successfully fabricated contacts to a p/n junction as normally employed in the manufacture of solar cells. The p/n junction is the charge separating barrier and is usually located within 1 micron from the surface exposed to solar radiation. It will be understood that if a solar cell with p/n junction is plasma sprayed, the hot molten particles may penetrate the junction region, thereby short circuiting the cell. We find that the same plasma spray parameters for spraying simple wafers of p or n type silicon with these alloys produce the ohmic contacts to p/n junction solar cells without ruining the junction. Generally, the ohmic contacts to the front surface of the solar cells need to be patterned, and plasma sprayed patterned contacts are obtained by spraying through a suitable mask, such as a ceramic slab containing slots.

It has also been found that the plasma spraying of contacts results in doping of silicon or other semiconductor material if dopants are introduced in the powder, preferably in the alloyed form. Thus spraying a Ni-P alloy on a p type wafer leads to an n/p junction below the contact. In a similar fashion spraying a Ni-B-Si alloy on an n wafer leads to a p/n junction below the contact. Note that boron is a p type dopant and phosphorous is an n type dopant. In accordance with our invention, the spraying of Ni-P on a p type wafer or Ni-B-Si on an n type wafer produces p/n junctions which can be photovoltaic.

Our invention therefore shows that it is possible to fabricate a doped layer below the contact as a result of arc plasma spraying. It is well known that a contact on a p type wafer functions better if a highly doped p+ layer is fabricated before applying the contacts. In a similar manner, an n+ layer is desired before applying contacts on an n region. It is, of course, expected that spraying of Ni-P will produce an underlying n+ layer below the contacts on an n wafer and, in a similar manner, spraying of Ni-B-Si on a p wafer will lead to a p+ layer under the contact. If the solar cells are sufficiently thin, these n+ or p+ layers produce back surface fields which improve the open circuit voltage of the solar cell, as discussed in the paper written by M. Wolf, "Conference Record of the Fourteenth IEEE Photovoltaic Specialists Conference, San Diego, Cal., January, 1980", IEEE, New York pages 563–568.

In summarizing, the present invention teaches the fabrication of ohmic contacts on p or n type semiconductor wafers by arc plasma spraying. Doping of the semiconductor to form a p+ or an n+ layer below the contact is possible by adding the proper dopant to the spray powder. Back surface field cells can be produced when the contacts are fabricated. The present invention further includes arc plasma spraying of both front and rear contacts to semiconductor wafers already containing p/n junctions to form solar cells directly, without resulting damage to the p/n junction solar cell electrical characteristics.

Where the contacts are applied by arc plasma spraying, good adhesion results without the necessity of any post deposition heat treatment, as is required in the case of electroless plated as well as silk screen printed contacts. Since post deposition heat treatment is not required, or if used, can be at a low temperature, the problem of diffusion of nickel to the junction, as well as the requirements for diffusion barriers, are eliminated. The one-step spraying process of the instant invention therefore replaces the multi-step plating or silk screen operations heretofore used, many of which steps require use of precious metals, such as palladium, gold, silver, etc.

Other objects, features and advantages of the invention shall become apparent as the description thereof proceeds when considered in connection with the accompanying illustrative drawing.

DESCRIPTION OF THE DRAWING

In the drawing which illustrates the best mode presently contemplated for carrying out the present invention.

DESCRIPTION OF THE INVENTION

Figure 1:
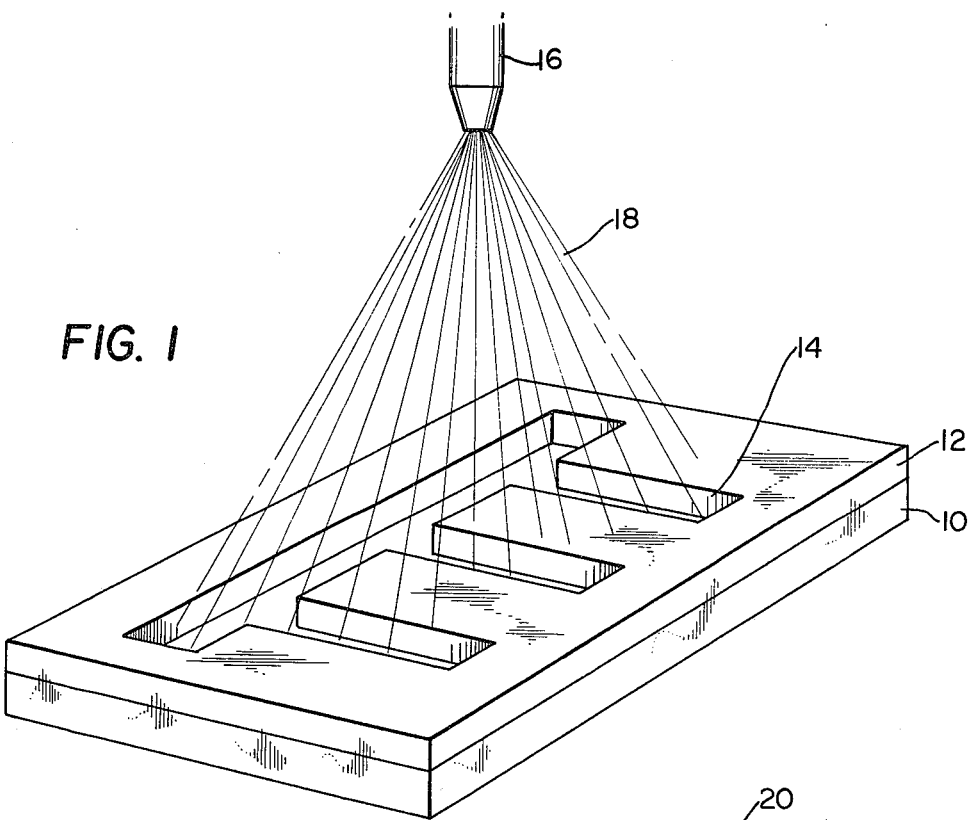
FIG. 1 is a perspective view showing an ohmic contact being applied to a semiconductor wafer by arc plasma spraying.
Figure 2:
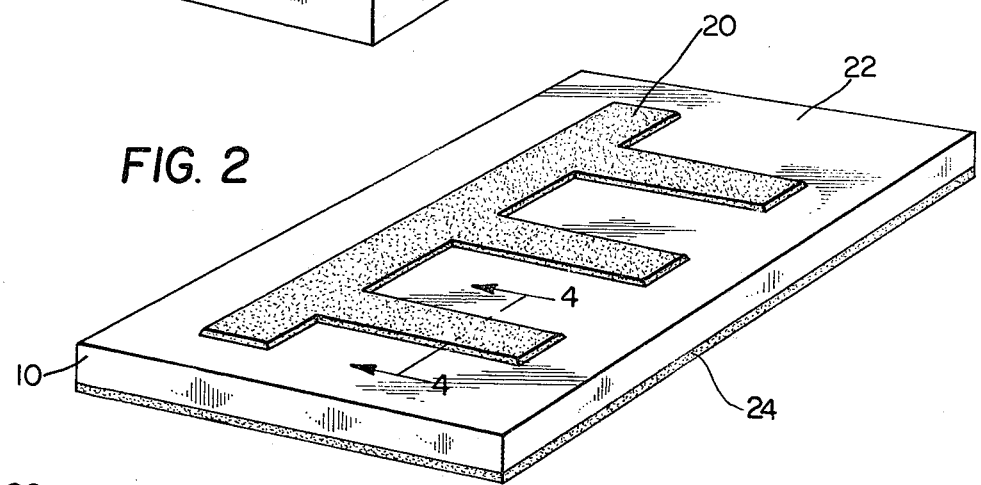
FIG. 2 is a perspective view of the semiconductor wafer after ohmic contacts have been applied by arc plasma spraying to both the front and rear surfaces thereof.
Figure 3:
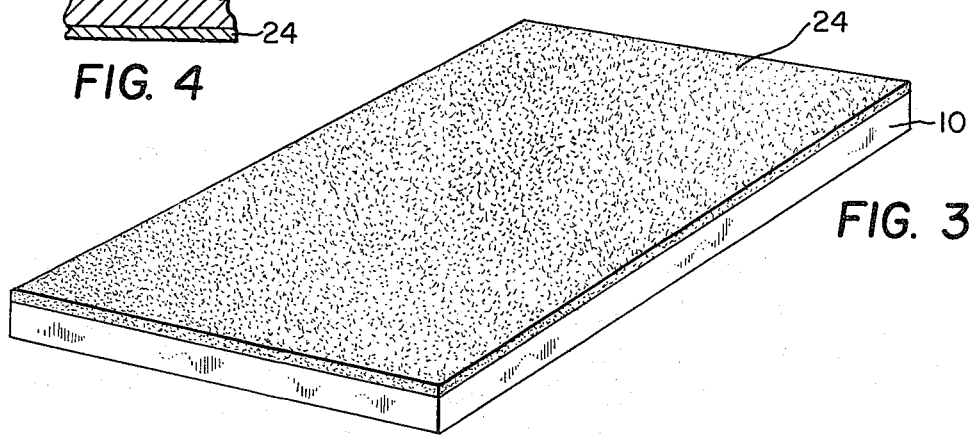
FIG. 3 is a perspective view showing the rear surface of the semiconductor wafer illustrated in FIG. 2.

Referring to the drawings, and specifically FIG. 1, a semiconductor wafer or body 10 is shown in the process of having an ohmic contact applied thereto by arc plasma spraying. Specifically, a mask 12 which may be a ceramic slab having openings 14 provided therein is superimposed over wafer 10 whereby the pattern defined by openings 14 will determine the pattern of the ohmic contact being applied. A spray gun 16 emits the spray 18 comprising the plasma beam with the desired metal particles therein, whereby the desired ohmic contact 20 is applied to the front surface 22 of wafer 10, by the arc plasma spraying process. After the ohmic contact 20 has been sprayed on to the front surface of wafer 10, the opposite or back surface of the wafer is likewise sprayed to achieve a back contact 24, which, as illustrated in FIG. 3, may cover the entire back surface of the wafer.

The arc plasma spray process can be employed successfully to fabricate ohmic contacts to several different semiconductors, as set forth in Table I below:

TABLE I

| SEMICONDUCTOR | OHMIC CONTACTS |
|---|---|
| Silicon (Si) n type | Nickel, Nickel-Phosphorous Molybdenum, Nickel-Aluminum & Copper |
| Silicon (Si) p type | Nickel, Nickel-Boron-Silicon, Aluminum-Silicon, Molybdenum, Nickel-Aluminum, & Copper |
| Copper Sulfide ($Cu_2S$) | Nickel & Copper |
| Gallium Arsenide (GaAs) n & p type | Aluminum alloys or Zinc alloys |
| Cadmium Sulfide (Cds) | Zinc |

The plasma spraying characteristics of several other alloys including nickel-chromium alloys have been evaluated, and these other alloys could also be employed.

The process parameters and alloy selections for several different plasma sprayed contacts are discussed below.

ALLOY SELECTIONS

When forming ohmic contacts to silicon, incorporation of the dopant in the plasma spraying powder for the appropriate type of silicon, is found to be a desirable practice. For this reason, a nickel-phosphorous alloy, for example, (Ni+10.8 Wt. % P) forms a better ohmic contact on n-type silicon than nickel. In a similar manner, a nickel-boron-silicon alloy for example, (Ni+4.3 Wt. % Si+2.8 wt. %B) forms a better ohmic contact on p-type silicon than does nickel. Other p and n type dopants can be employed in a similar manner.

It is usually preferable to fabricate ohmic contacts employing eutectic alloys (for example, NiP, Ni-B-Si) instead of pure metals due to the surface characteristics of the deposits. Nickel and other pure metals (for example, molybdenum) form columnar structures and the ohmic contacts appear rough. When thin (approximately 10 μm) layers are deposited, the columnar deposits tend to be unconnected. However, the eutectic alloys, including Al-12 Wt. % Si alloy, flow readily and form smooth continuous ohmic contacts.

Since the plasma conditions could be altered easily by altering the voltage, current and the gas flow rate, it is possible to handle a variety of powders which have very different melting characteristics. The important factor here is the power (i.e. voltage [V] × current [I]) per unit volume of the plasma gas. Naturally, higher melting powders require larger voltage-current products. Addition of secondary gases into the plasma arc can increase the voltage, and higher power levels can be attained. The addition of helium (He) as the secondary gas increases the particle velocity of the melted powder.

The distance of the gun from the sprayed semiconductor needs to be optimized. If the distance is too large, the heated particles cool rapidly and no coherant deposit is formed. When the gun is placed too close to the semiconductor, undesirable overheating of the semiconductor can occur.

Based on the foregoing, the power level required to melt and spray molybdenum is higher than that required for nickel, etc.

The nickel alloys attain a minimum temperature of the melting point of the alloy. At this temperature the diffusion of the dopant is possible as indicated earlier. The aluminum-silicon alloy, however, does not seem to attain high enough temperature to allow the diffusion of aluminum.

If the plasma sprayed silicon is heated after deposition to approximately 800° C. the dopants can diffuse into the silicon. However, elements such as nickel, copper and iron have a high diffusion coefficient at these temperatures and may degrade a p/n junction previously fabricated in the silicon.

If nickel-aluminum or nickel-chromium alloys are used for contacts, the formation of inter-metallic compositions will prevent the diffusion of these transition metals. These alloys are therefore preferable for those situations where post-deposition heat treatment is required for any reason, such as stress relief, etc.

PARTICLE SIZES

All alloys were found to be suitable for plasma spraying when the particle sizes were in the range of 5 μm to 40 μm. Particles above 40 μm tend not to melt completely and particles below 5 μm are not transported efficiently in the plasma stream. Spherical atomized powders flow uniformly through the powder-feed systems and can be metered and delivered to the plasma more efficiently than angular particles. Most of the previously discussed powders are atomized spheres with the exception of ground silicon and copper sulfide.

CONTACT QUALITY

Figure 4:
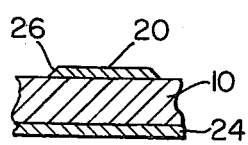
FIG. 4 is a section on line 4—4 of FIG. 2.

Since the sprayed metallic contacts have a different thermal expansion coefficient from that of silicon, thermal stresses arise. As a result of detailed calculations of these thermal stresses, it has been found that thicker contact layers are in severe thermal stress and can break the silicon-ohmic contact bond. This depends upon the structure of the interface between the silicon and the ohmic contact. The stress calculations also show that it is preferable to taper the edges of the deposits. The plasma spraying process which we employ produces a cone-like pattern (See FIG. 1) of spray deposit. Spraying through a mask leads to contact deposits having beveled edges as shown in FIG. 4 at 26. Thus, good contact adhesion is maintained.

It is common practice to sandblast articles before they are plasma sprayed in order to improve the mechanical bond between the sprayed layer and the substrate. If the silicon wafers are smooth and polished it has been found that the initial on-rush of particles produces a point-bonding and the layer builds up on the point-bonds. Etching the silicon wafer in hydrofloric acid (HF) to remove the oxide films prior to plasma spraying tends to increase the number of point-bonds. Nickel aluminide and molybdenum coatings produce substantially more bonding points than aluminum eutectic alloys. It is thought that this is due to the reactivity of the two alloys.

It has been found that thicker layers (approximately 100 μm) can be fabricated on rough silicon surfaces such as an arc plasma sprayed deposit of silicon.

Relatively thin layers (less than 5 μm) tend to be disconnected and unreliable. Preferable thickness of sprayed ohmic contacts is in the range of 15–25 μm.

The table below lists various specific examples of several ohmic contacts formed by this process.

TABLE II

Aluminum-Silicon (Al—Si)

| Composition | Al + 12% Si |
|---|---|
| Powders | 10 to 44 μm spherical configuration |

Forms ohmic contacts to p silicon;
Smooth deposits result.
Thickness of deposits - 5 μm to 25 μm on polished silicon wafers.
Plasma gas - argon (Ar)
Plasma arc voltage - 32 V
Plasma arc current - 500 A
Silicon wafers held approximately 5 inches from arc plasma spray gun.
Results in poor attachment to polished silicon.
Deposits not solderable.

Nickel (Ni)

| Composition | Ni |
|---|---|
| Powders | 10 to 44 μm spherical configuration |

Forms ohmic contacts to n & p type silicon;
Rough deposits result.
Thickness of deposits - 5 μm to 25 μm on polished silicon wafers.
Plasma gas - argon (Ar)
Plasma arc voltage - 32 V
Plasma arc current 700 A
Silicon wafers held approximately 5 to 6 inches from arc plasma spray gun.
Results in reasonable attachment of deposits to polished silicon.
Deposits are solderable.

Nickel-Phosphorous (NiP)

| Composition | Ni + 10.8% P |
|---|---|
| Powders | 10 to 44 μm |

Forms ohmic contacts to n type wafers;
Smooth deposits result.
Thickness of deposits 5 μm to 25 μm on polished silicon wafers.
Plasma gas - argon (Ar)
Plasma arc voltage - 32 V
Plasma arc current - 600 A
Silicon wafers held approximately 5 to 6 inches from arc plasma spray gun.
Results in reasonable attachment of deposit to polished silicon wafers.
Deposits solderable.

TABLE II-continued

Nickel-Boron-Silicon (Ni—B—Si)

| Composition | Ni + 2.8% B, 4.3% Si |
|---|---|
| Powders | 10 to 44 μm spherical |

Forms ohmic contacts to p-type wafers;
Smooth deposits result.
Thickness of deposits - 5 μm to 25 μm on polished silicon wafers.
Plasma gas - argon (Ar)
Plasma arc voltage - 32 V
Plasma arc current - 600 A
Silicon wafers held approximately 5 inches from arc plasma spray gun.
Results in reasonable attachment to polished silicon wafers.
Deposits solderable.

Molybdenum (Mo)

| Composition | Mo |
|---|---|
| Powders | 10 to 44 μm |

Forms good contacts to p & n silicon
Rough deposits result.
Thickness of deposits - 5 μm to 40 μm on polished silicon wafers.
Plasma gas - argon (Ar)
additions of helium (He) possible
Plasma arc voltage - 32 V
Plasma arc current - 800–1000 A
Silicon wafers held approximately 5 to 7 inches from arc plasma spray gun.
Results in good attachment of deposits.
Deposits not solderable.

Nickel-Aluminum (Ni—Al)

| Composition | $Ni_{50}Al_{50}$ (atom percentages) |
|---|---|
| Powders | 10 to 44 μm particles of Ni and Al |

Forms good contacts to p & n silicon;
Good deposits, smooth.
Thickness of deposits - 5 μm to 40 μm on polished silicon wafers.
Plasma gas - argon (Ar)
additions of helium (He) possible
Plasma arc voltage - 32 V
Plasma arc current - 800–1000 A
Silicon wafers held approximately 5 to 7 inches between gun and wafer.
Results in good attachment of deposits.
Deposits solderable.

While there is shown and described herein certain specific structure embodying the invention, it will be manifest to those skilled in the art that various modifications and rearrangements of the parts may be made without departing from the spirit and scope of the underlying inventive concept and that the same is not limited to the particular forms herein shown and described except insofar as indicated by the scope of the appended claims.

What is claimed is:

1. A method of applying ohmic contacts to a semiconductor body comprising the step of depositing a metal powder directly on a surface of the semiconductor by arc plasma spraying, the thickness of said contacts being in the range of from about 5 to about 40 microns.

2. The method of claim 1 in which the semiconductor is n- or p-type silicon and the metal is nickel.

3. The method of claim 1 in which the semiconductor is n- or p-type silicon and the metal is copper.

4. The method of claim 1 in which the semiconductor is p-type or n-type gallium arsenide and the metal is aluminum.

5. A method of applying ohmic contacts to a semiconductor body so as to provide a doped layer below the contacts comprising the step of depositing thereon by arc plasma spraying a metal powder containing a dopant of the semiconductor.

6. The method of claim 5 in which the semiconductor is n-type silicon and the metal is nickel-phosphorous alloy of eutectic composition.

7. The method of claim 5 in which the semiconductor is p-type silicon and the metal is nickel-boron-silicon alloy of eutectic composition.

8. The method of claim 5 in which the semiconductor is p-type silicon and the metal is aluminum-silicon alloy of the eutectic composition.

9. The method of claim 5 in which the semiconductor is p-type gallium arsenide and the metal is zinc alloy.

10. The method of claim 5 in which the semiconductor is n-type gallium arsenide and the metal is an aluminum silicon alloy of eutectic composition.

11. The method of claim 5 further characterized in that the metal powder is arc plasma sprayed so as to form contacts having a thickness in the range of 5 to 40 microns.

12. A p-n junction solar cell having arc plasma sprayed ohmic contacts on the p side or n side of the junction, the thickness of said contact being in the range of from about 5 to about 40 microns.

13. The solar cell of claim 12 further characterized in that said ohmic contacts have bevelled edge surfaces.

14. A silicon p-n junction solar cell having an arc plasma sprayed ohmic contact of nickel phosphorous alloy on the n side of the junction and an ohmic contact of an alloy containing nickel and boron on the p side of the junction.

15. The solar cell of claim 14 further characterized in that said ohmic contacts have a thickness in the range of 5 to 40 microns.

16. A silicon p-n junction solar cell having an arc plasma sprayed contact of nickel-aluminum alloy on the p side of the junction.

17. A method of providing a back surface field solar cell comprising the step of depositing over the back surface of the solar cell by arc plasma spraying a dopant containing powder which produces the same conductivity type semiconductor as the dominant dopant in the base region.

18. The method of claim 17 in which the solar cell is a silicon solar cell having a p-type base region and the powder is an aluminum-silicon alloy.

19. The method of claim 17 in which the solar cell is a silicon solar cell having an n-type base region and the powder is a nickel phosphorous alloy.

* * * * *